United States Patent
Millman et al.

(10) Patent No.: US 10,356,967 B2
(45) Date of Patent: Jul. 16, 2019

(54) METHOD FOR MANUFACTURING AN IMAGE DISPLAY

(71) Applicant: Gallery Blocks LLC, Baltimore, MD (US)

(72) Inventors: Ryan J. Millman, Baltimore, MD (US); Cheyne Smith, Manchester, MD (US)

(73) Assignee: Gallery Blocks LLC, Hunt Valley, MD (US)

( * ) Notice: Subject to any disclaimer, the term of this patent is extended or adjusted under 35 U.S.C. 154(b) by 179 days.

(21) Appl. No.: 15/295,759

(22) Filed: Oct. 17, 2016

(65) Prior Publication Data

US 2017/0112028 A1    Apr. 20, 2017

Related U.S. Application Data

(60) Provisional application No. 62/242,762, filed on Oct. 16, 2015.

(51) Int. Cl.
*H05K 13/00* (2006.01)
*G09F 1/06* (2006.01)

(52) U.S. Cl.
CPC .............. *H05K 13/00* (2013.01); *G09F 1/06* (2013.01); *H05K 13/0053* (2013.01)

(58) Field of Classification Search
CPC ... A47B 96/202; A47G 1/0633; G02F 1/3333; G02F 1/133351; G02F 1/135; G09F 1/06; H05K 13/00; H05K 13/0053
See application file for complete search history.

(56) References Cited

U.S. PATENT DOCUMENTS

| | | | | |
|---|---|---|---|---|
| 7,322,140 B2* | 1/2008 | Peery | ................... | A47G 1/0633 40/786 |
| 7,621,033 B2 | 11/2009 | Rochford et al. | | |
| 7,823,309 B2* | 11/2010 | Albenda | ............... | A47B 96/202 206/736 |
| 8,363,071 B2* | 1/2013 | Kondo | ................. | G09G 3/2022 345/63 |
| 9,174,483 B2* | 11/2015 | Ridless | ................... | A47G 1/141 |

(Continued)

FOREIGN PATENT DOCUMENTS

CN          103488455 A        1/2014

*Primary Examiner* — Carl J Arbes
(74) *Attorney, Agent, or Firm* — Sterne, Kessler, Goldstein & Fox P.L.L.C.

(57) ABSTRACT

Described herein is an apparatus and method for manufacturing an image display. The apparatus provides an automated method for efficient production of a finished image display, beginning with a planar, unassembled, image display and resulting with a fully-assembled image display in its final form, such as a cube-shaped image display with a plurality of images affixed thereto. In one embodiment, the apparatus is machinery configured as a semi-automated workstation, configured with four jigs stationed on a rotating platform housed on a workstation base. The rotating platform is configured for 360 degree rotation and advancing each jig through one of four work positions. The rotating platform is controlled by a control panel, which can be operated manually or automated. In one embodiment, the machinery is capable of high through-put manufacturing—up to three hundred image display cubes in one hour of operation.

9 Claims, 9 Drawing Sheets

(56) References Cited

U.S. PATENT DOCUMENTS

| | | |
|---|---|---|
| 2010/0332005 A1 | 12/2010 | Lemelin et al. |
| 2012/0188493 A1* | 7/2012 | Sato .................. G02F 1/133351 349/104 |
| 2013/0059126 A1* | 3/2013 | Ridless .................. A47G 1/141 428/175 |
| 2014/0326420 A1 | 11/2014 | Kaishian et al. |
| 2014/0339752 A1 | 11/2014 | Lanne et al. |

* cited by examiner

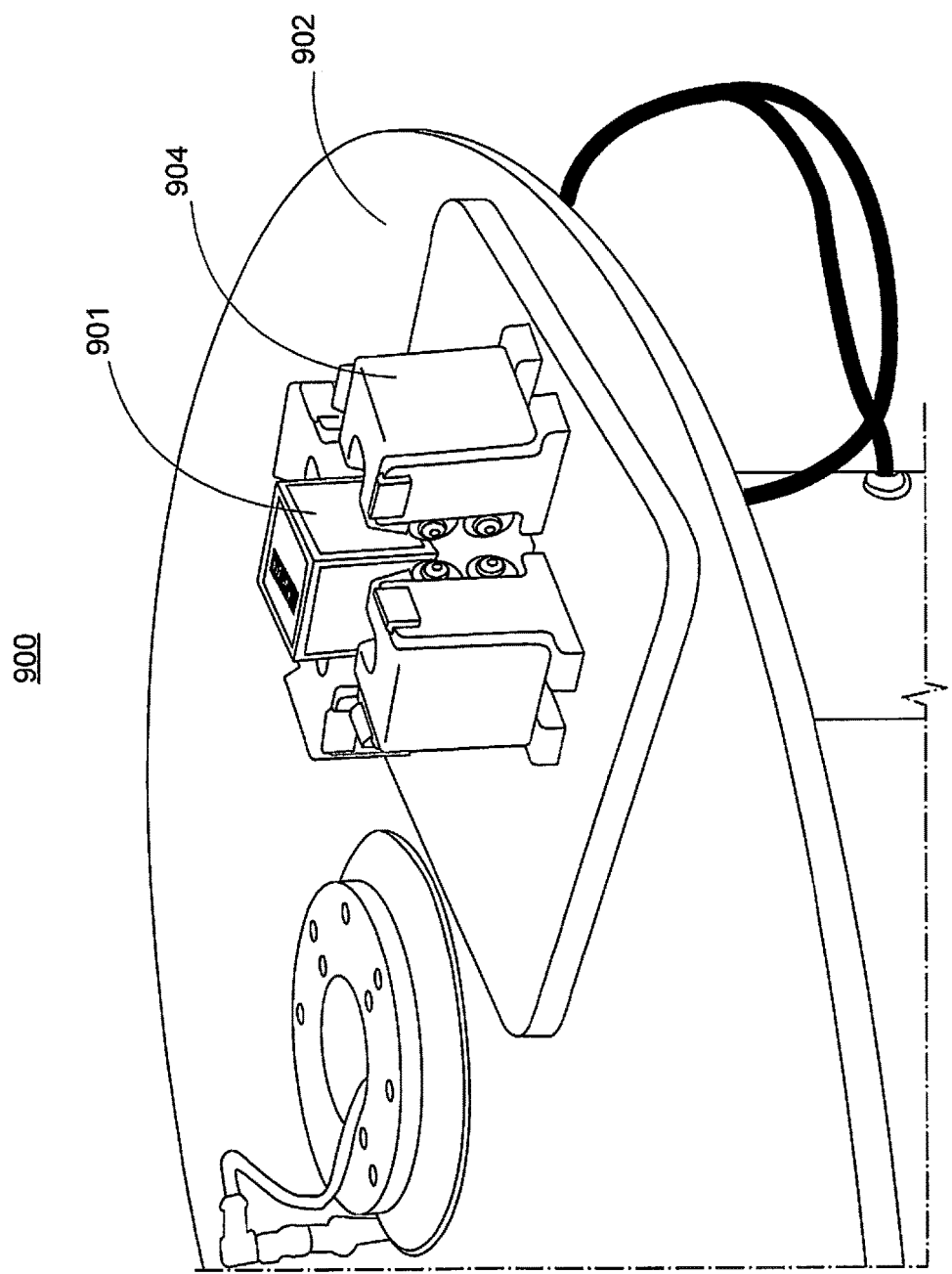

METHOD FOR MANUFACTURING AN IMAGE DISPLAY

CROSS REFERENCE TO RELATED APPLICATIONS

This application claims priority to earlier filed U.S. Provisional patent application No. 62/242,762, filed on Oct. 16, 2015, the contents of which are herein incorporated by reference in their entirety.

FIELD OF INVENTION

The invention relates to manufacturing machinery, specifically, machinery for automated assembly of image displays formed from unassembled materials.

BACKGROUND

Current methods of assembling image displays, such as image displays that require inward folding of image display materials, require hours of labor to produce this product on a manufacturing level, because there was no way of automating an otherwise manual process. An automated process is needed in order to reduce labor and increase output and quality of image display products.

BRIEF SUMMARY

Described herein is an apparatus and method for manufacturing an image display. The apparatus provides an automated method for efficient production of a finished image display, beginning with a planar, unassembled, image display and resulting with a fully-assembled image display in its final form, such as a cube-shaped image display with a plurality of images affixed thereto.

In one embodiment, the apparatus is machinery configured as a semi-automated workstation, configured with four jigs stationed on a rotating platform housed on a workstation base. The rotating platform is configured for 360 degree rotation and advancing each jig through one of four work positions. The rotating platform is controlled by a control panel, which can be operated manually or automated. In one embodiment, the machinery is capable of high through-put manufacturing—up to three hundred image display cubes in one hour of operation.

In one embodiment, work position number one is configured as a loading/unloading position, wherein an unassembled image display is inserted into the jig and upon full rotation through the work positions, wherein a fully assembled image display is then removed from the jig.

In one embodiment, work position number two is configured with a compression/forming position, wherein a mandrill (compression member) moves downward from an overhead position above the jig and upon making contact with the unassembled image display, pushes the unassembled image display downward into the jig and into a position to conform to the shape of the jig—in this case a partial cube comprised of a bottom and three sides, wherein the top is not fully in position on the cube.

In one embodiment, work position number three is configured with a robotic-arm device configured for application of hot glue to one or both of the corners and sides of the partially assembled image display, and a roller member for folding the top panel of the cube onto the cube body, thereby closing the cube and forming the assembled image display.

In one embodiment, work position number four is configured as a curing position, configured to hold the assembled image display until the glue is set and dry. Work position number four is configured with a pneumatic member to push/eject the cube partially from the jig, for ease of removal once the jig has been advanced to the first work position (load/unload position).

In one embodiment, the image display is comprised of a planar base with an image face for securing attachment of a printed image, and a non-image face, the non-image face comprising a plurality of v-shaped grooves that extend inward toward the image face of the base without traversing the base, thereby creating a hinge point whereupon folding of the base inward along the v-grooves creates a near perfect 90 degree angle. The arraignment of the v-grooves and resulting corners created provide an overall shape to the image display, including but not limited to, a cube-shaped image display. In one embodiment, the image display is comprised of an assembled image display base that has been folded inward along the v-grooves, and whereon one or more of an image are affixed to the image face of the display. In another embodiment, the image display comprises closure means, such as inner magnetic closures to hold the image display in its assembled form. In yet another embodiment, the image display is configured with hanging means, such as a hook or a ribbon, for hanging the cube-shaped ornament for display.

BRIEF DESCRIPTION OF THE DRAWINGS

FIG. 9 shows a fourth work position showing a fully-assembled and securely sealed image display cube as it is pushed out of the jig via the pneumatic member.

DETAILED DESCRIPTION OF THE INVENTION

Figure 1:
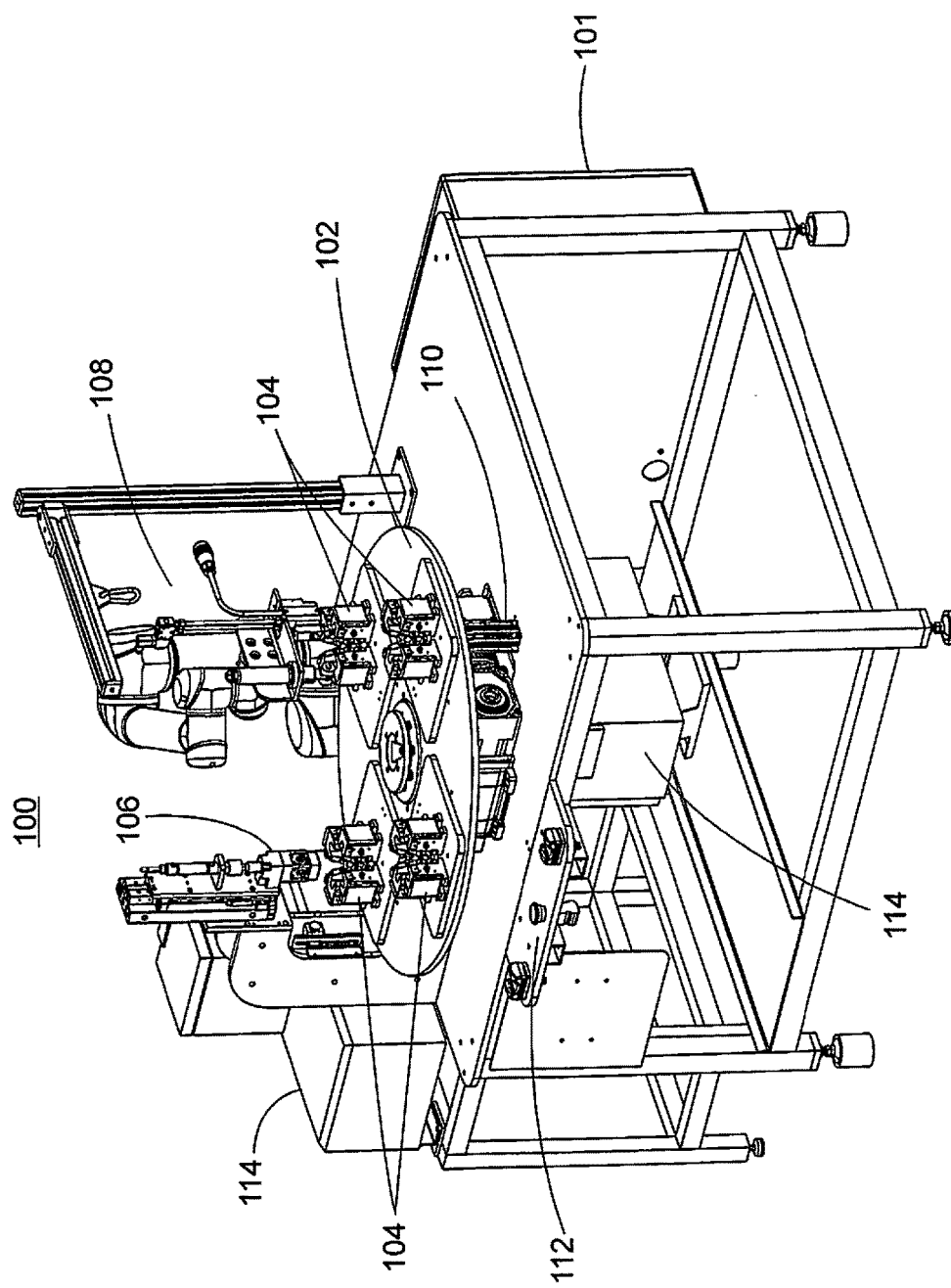
FIG. 1 shows a front/side view of the workstation according to one embodiment of the present invention.

Described herein is a workstation and method for manufacturing three-dimensional image displays from corresponding blanks. In one embodiment, various sizes of unassembled image display blanks are envisioned. In one embodiment, the image display is a four or five sided cube-shaped image display (when assembled), in other embodiments different shapes and sizes are envisioned, and jigs made be arranged to accommodate various sizes and shaped, accordingly. One example of an image display blank is described in U.S. patent application Ser. No. 14/936,105, filed on Nov. 9, 2015, the contents of which are herein incorporated by reference. It should be understood that the image display may comprise one or more images affixed to one or more image faces of the image display prior to or following assembly. Therefore, it is envisioned that each "blank" may comprise one or more images along the image face of the blank.

In one embodiment, a workstation for manufacturing three-dimensional image displays from corresponding blanks, the displays having multiple image sides in different orientations relative to a longitudinal plane upon exiting the workstation, comprises: a plurality of work positions adapted to perform corresponding manufacturing operations related to the blanks; a selectively rotatable turntable; multiple jigs disposed on the turntable at discrete angular locations about the circumference of the turntable, the locations corresponding to the work positions of the work station for processing the blanks, wherein the jigs are adapted to receive the blanks thereon, wherein the jigs are identical to each other functionally to permit the blanks received thereon to be processed at each of the work positions upon cycling through the work position; each of the jigs having an upper surface and an aperture defined therein with sidewalls extending to a bottom area of the aperture, the upper surface sized to receive one of the blanks thereon, the sidewalls at least partially defining outer surfaces of a three-dimensional volume, the sidewalls of the aperture oriented to correspond to the angular orientations of the image sides of the image display to be manufactured, wherein the aperture has a cross-sectional area sized to receive a first portion of the blank corresponding to one of the image sides; wherein the work positions include a first work position, the first work position configured to allow sufficient access to the upper surface of the jig located in the first position to load blanks on the upper surface with the portions of the blanks extending over the aperture, and to unload assembled image displays from the jig; wherein the work positions include a second work position, the second work position including a motor-driven mandrill mounted in operative proximity to the turntable, the mandrill having a forming end sized to correspond to the volume defined by the aperture, the mandrill being aligned with the aperture of the jig when in the second work position and moveable by the motor relatively toward the turntable upper surface of the jig a sufficient distance to contact the blank disposed on the upper surface of the jig, urge the first portion of the blank extending over the aperture into the aperture and cause additional portions of the blank adjacent to the first portion to contact the aperture sidewalls and fold inwardly to define an image display shape corresponding to the aperture volume; wherein the work positions include a third work position, the third work position including a motor-driven arm having a distal end operative to fold a second additional portion of the blank to close the three-dimensional shape; and wherein the work positions include a fourth work position, the fourth work position including a pneumatic member located in operative proximity to the turntable, the pneumatic member having a pneumatic member end located below the aperture of the jig, the jig and turntable having passages in pneumatic communication with the pneumatic member when the jig is in the fourth work position, whereby application of pneumatically-applied force urges the blank, after being closed in work position three, to at least partially exit the aperture.

In another embodiment, the workstation further comprises a glue gun having a nozzle positionable at work position three in operative proximity to the additional portion of the blank to be folded to close the three-dimensional shape, the glue gun being operable to dispose adhesive on or adjacent to the second additional portion prior to operation of the motor-driven arm to fold the second additional portion.

In another embodiment, the workstation further comprises a programmable logic controller and programming for selectively operating the motor-driven mandrill, arm, glue gun, and pneumatic member to perform the operations associated with the work positions.

In another embodiment, the workstation further comprises rollers mounted proximate to the aperture, and wherein inwardly facing portions of the rollers define portions of the sidewalls of the aperture.

In one embodiment, a method of manufacturing an image display having multiple image display sides, the method comprises: providing a substantially planar blank corresponding to an unassembled form of the image display, the blank terminating in perimeter edges, the blank having an image face and a non-image face opposite the image face, the faces extending between the perimeter edges, and a plurality of v-grooves extending in planar directions along the non-image face and inwardly from the non-image face without traversing the image face to create corresponding fold lines in the blank, the v-grooves spaced from each other to define portions of the blank, the portions corresponding to the image display sides of the image display when assembled, the v-grooves comprising channels having opposing walls; positioning a first one of the portions of the blank in alignment with an aperture sized to receive the first portion therein, the aperture having sidewalls extending by a predetermined depth to terminate in a bottom area, the bottom area and the first portion spaced from each other by a predetermined distance; moving the first portion of the blank and the aperture relative to each other to reduce the distance between the first portion and the bottom area; providing additional portions of the blank secured adjacent to the first portion and having corresponding ones of the v-grooves between the first portion and the additional portions; guiding the additional portions along the sides of the aperture, wherein the first portion is urged a sufficient distance to bring the opposing walls of the corresponding v-channels between the first portion and the additional portions into opposing relationships corresponding to the positions of the image display sides of the image display when assembled; folding at least one of the portions of the blank so that at least one of the perimeter edges is in opposing contact with at least another one of the perimeter edges; and moving the first portion and the bottom area of the aperture relatively away from each other by an amount sufficient to access the image display sides.

In one embodiment, a step of providing the blank comprises defining the first portion of the blank and the additional portions adjacent to the first portion as squares, the first portion having four v-grooves defining four corresponding right angles and defining the perimeter of the square of the first portion; wherein the step of moving the first portion and the aperture relative to each other comprises moving the first square portion relative to the aperture by an amount sufficient to bring opposing walls of the four v-grooves into opposing contact to define a base and four sides having upper edges, the four sides extending orthogonally from the base; and wherein the folding step comprises moving a sixth square portion of the blank having edges defining a sixth square perimeter to have the edges of the sixth square perimeter oppose the upper edges of the four sides, whereby the assembled blank comprises a cube.

In another embodiment, the method further comprises the step of generating a positive signal when the first portion is positioned in alignment with the aperture.

In another embodiment, the steps of moving the first portion and the aperture relative to each other, guiding the adjacent portions, applying adhesive, and folding the at least one portion are performed without intervention.

In one embodiment, the step of moving the first portion and the aperture to reduce the distance includes applying force to the non-image surface to urge the first portion toward the bottom area of the aperture.

In one embodiment, the method comprises cycling the blank through four stations to form the image display, the first station performing the step of aligning the blank with the aperture by receiving the blank and engaging the perimeter edges to align the first portion of the blank with the aperture and to maintain the first portion a predetermined distance from the bottom area of the aperture, the second station performing the step of moving the first portion and bottom area relative to each other by urging the first portion toward the bottom area while guiding the additional, adjacent portions along the sidewalls of the aperture to form the sides of the item image display, the third station performing the steps of applying the adhesive at least to the perimeter edges corresponding to upper side edges of the additional portions and thereafter folding the at least one portion to contact the adhesive disposed on upper side edges, and the fourth station performing the step of moving the first portion and the bottom area relative to each other by an amount sufficient to access the display sides by moving the folded blank away from the bottom area.

In another embodiment, a method of manufacturing an image display having multiple display sides, the method comprises: cycling a blank corresponding to an unassembled form of the image display through at least three, consecutive automated, assembly stages accomplished without manual intervention; wherein the step of cycling through the first stage comprises folding portions of the blank corresponding to the multiple display sides relative to each other along v-shaped grooves to form at least some of the multiple image display sides of the image display; wherein the step of cycling through the second stage comprises applying adhesive to edges of the blank and subsequently folding at least one additional portion of the blank to contact the adhesive; wherein the step of cycling through the third stage comprises retaining the folded blank in a first position for a predetermined time selected to allow the adhesive to set sufficiently to fix the image display sides relative to each other during at least one of subsequent processing or termination of the cycling through the stages; and moving the blank to a second position located to permit access to the image display sidewalls.

In one embodiment, the blank is positioned on a jig prior to cycling the blank through the automated stages, and the automated stages involve rotating the jig with the blank thereon between work positions, the work positions performing the steps of the cycling stages while the blank is associated with the jig.

In one embodiment, adhesive is applied to one or more of the perimeter edges of the blank prior to the folding step to locate adhesive between opposing perimeter edges in contact with each other, and further including providing the opposing perimeter edges with means to fix them relative to each other, wherein the means to fix the perimeter edges is selected from the group consisting of magnetic material, hook-and-loop material, and adhesive.

In one embodiment, the workstation further comprises a control system for controlling the workstation, the system comprising control means for each of the work positions (first work position, second work position, third work position and fourth work position) and power means for powering the work positions. In one embodiment, the control system controls the overall operation of the apparatus, including but not limited to: a stop/start function of the workstation, the advancement of the turntable through one or more work positions, the compression mandrill, the robotic arm (including roller extension and glue gun), and the pneumatic member. One or more motors (fuel powered or electric) power the overall system, with each workstation comprising its own power source, or, alternatively a centralized power system that powers each work position from a central source. In one embodiment, power source is powered by an electrical outlet (DC circuit), although may include a back-up battery source in the event of a power failure.

In one embodiment, the control system comprises one or more microprocessors for automated control of the workstation, and for storage of output data, such as machine conditions, through-put of assembled image displays, and the like. The control means may be configured to store data of various conditions for assembly, or information related to the blanks—such as the kind and thickness of the blanks, folding positions, and folding instructions. In one embodiment, control system comprises a signal indicating completion of a work position, which may in turn signal the turntable to advance to the next work position.

Reference is now made to the figures, which show exemplary embodiments of the invention.

FIG. 1 shows an overview of an apparatus for assembly of an image display, comprising an automated workstation 100. The apparatus comprises, in part: a base table 101 configured with a rotating platform, or turntable, 102 whereupon a plurality of jigs 104 are attached. The jigs 104 are moved through one or more work positions. One work position comprises a motorized compression member or mandrill 106, another work position comprises a motorized robotic arm 108, and another work position comprises a pneumatic member 110. Workstation 100 is controlled by a control panel 112 that may be manually controlled, automated, or controlled via a microprocessor or PLC. In one embodiment, table 101 is height adjustable. In another embodiment, table comprises table legs configured with wheels or casters for providing a mobile workstation. In one embodiment, workstation 100 is made of standard machinery materials as known in the manufacturing arts, including but not limited to: steel, aluminum, High Density Polyurethane, acetal resin (Delrin), and other natural and/or synthetic materials. The workstation is scalable and modular, so that the workstation can be easily portable and assembled for high-throughput assembly of image display blanks, and then easily disassembled and stowed if needed.

In one embodiment, the rotatable turntable 102 causes the jigs 104 to move through with a plurality of work positions, including a work position comprising the mandrill 106 with a forming end in position above the jig, configured for assembly of an unassembled planar image display resting in position on the jig, upon insertion of the mandrill end into the jig; a work position comprising the robotic arm 108 configured with a glue gun and roller extension that move in synchronized fashion to apply glue to a portion of the image display via the glue gun and seal open edges of the image display in order to form a cube image display; a workstation comprising the pneumatic member 110 that upon force applied from beneath the jig, ejects the assembled image display from the jig; one or more power units 114; one or more processing units (not shown); one or more visual control displays (which may be integrated with control panel 112); one or more alert or safety features; and means of timing movement of the jig from a first position to a subsequent position at timed intervals.

Figure 2:
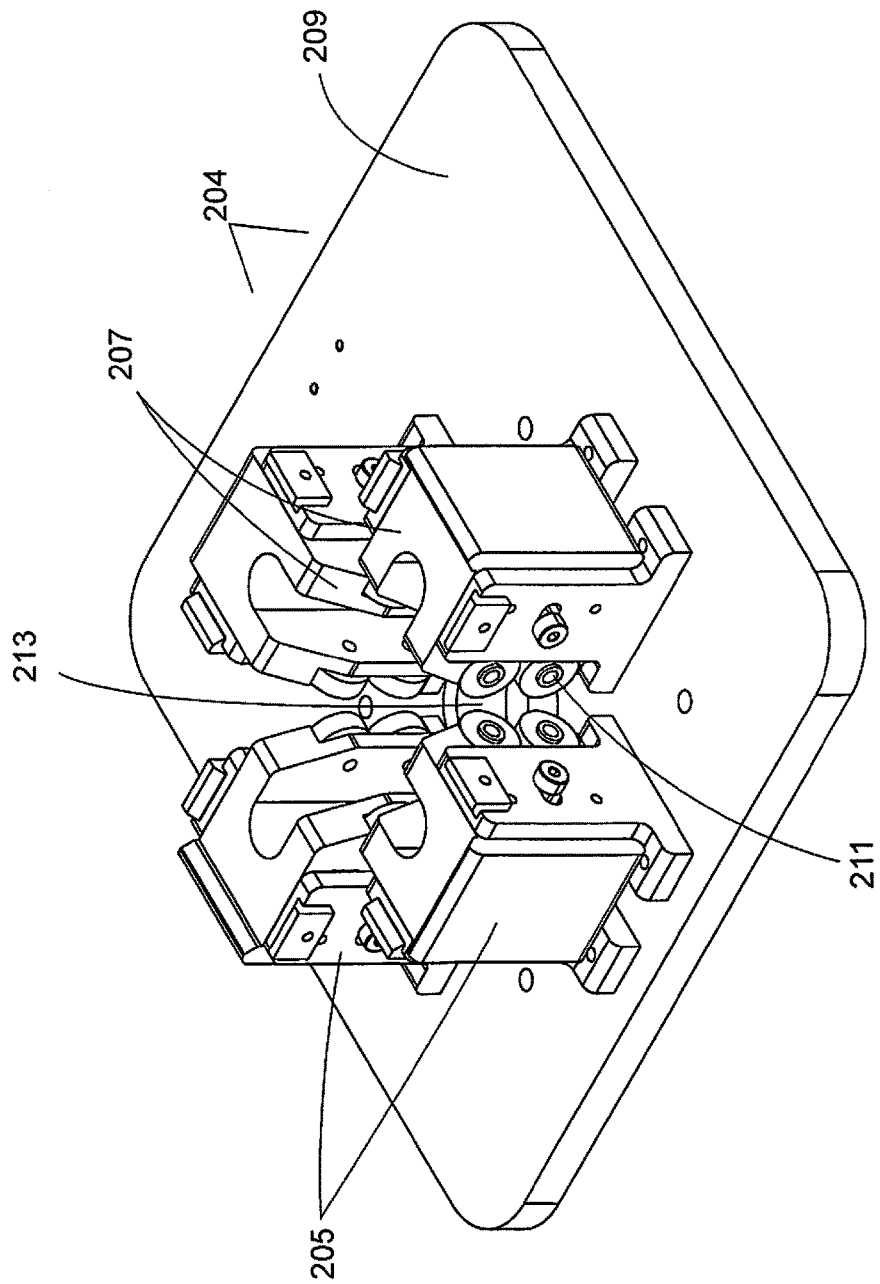
FIG. 2 shows a top view of a jig according to one embodiment of the present invention.

FIG. 2 shows an expanded view of a jig 204 comprising: side-support members 205 forming sidewalls 207 and arranged on a jig base 209, the side-support members 205 forming an inner cavity with the shape of a cube. In one embodiment the side supports members are spring-loaded for even tension around the image display. In another embodiment, side support members 205 are configured with rollers 211 on an inner surface that provide means of facilitating movement of the image display in and out of the inner cavity of the jig 204. The sidewalls 207 define a volume in the inner cavity consistent with an image display size to be manufactured. An opening 213 in jig base 209 is commensurate in size with pneumatic member, and provides access by pneumatic member to eject an assembled image display from the jig when positioned accordingly on the workstation.

Figure 3:
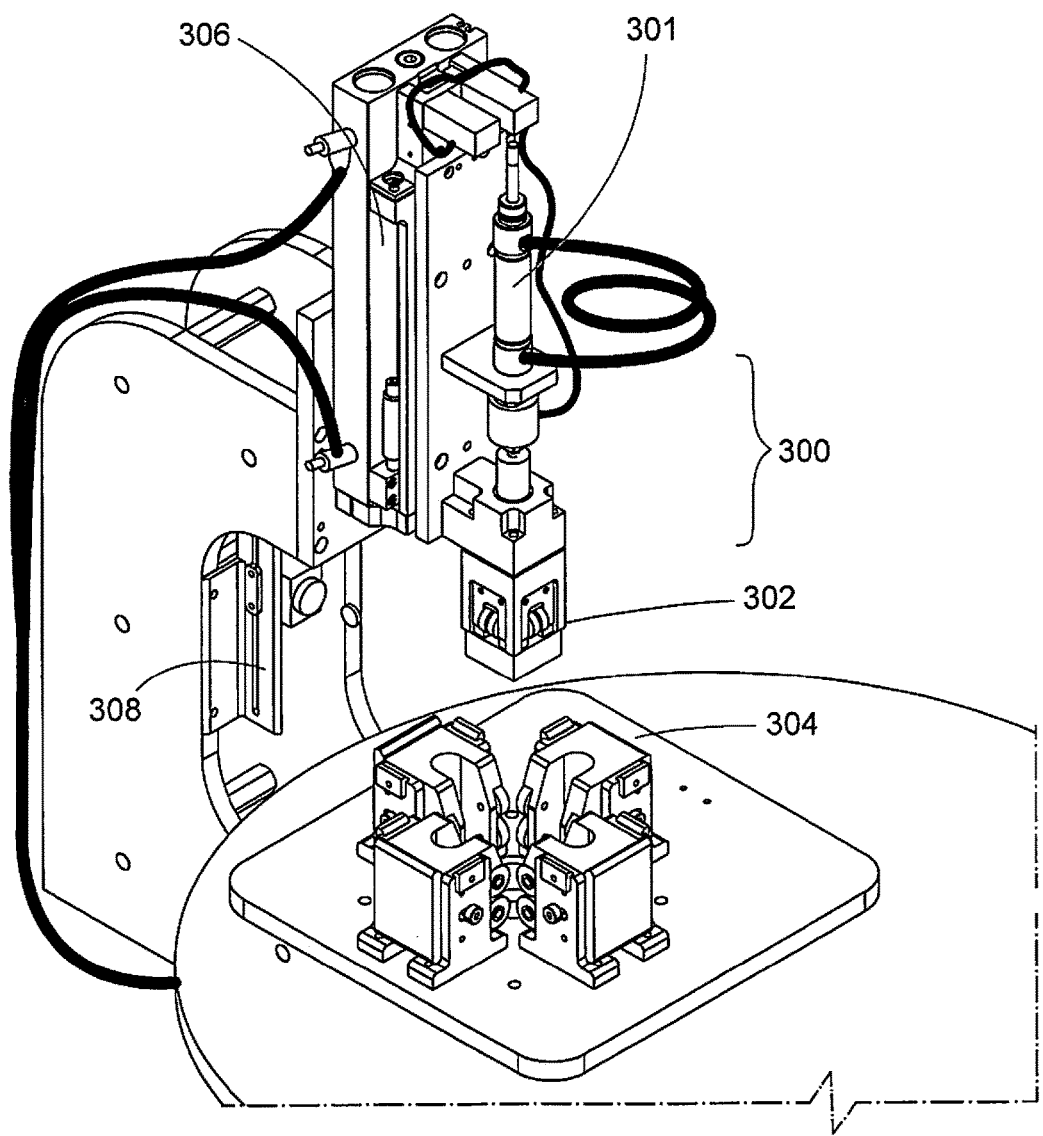
FIG. 3 shows a side view of part of the assembly/forming unit comprising a mandrill, according to one embodiment of the present invention.
Figure 4:
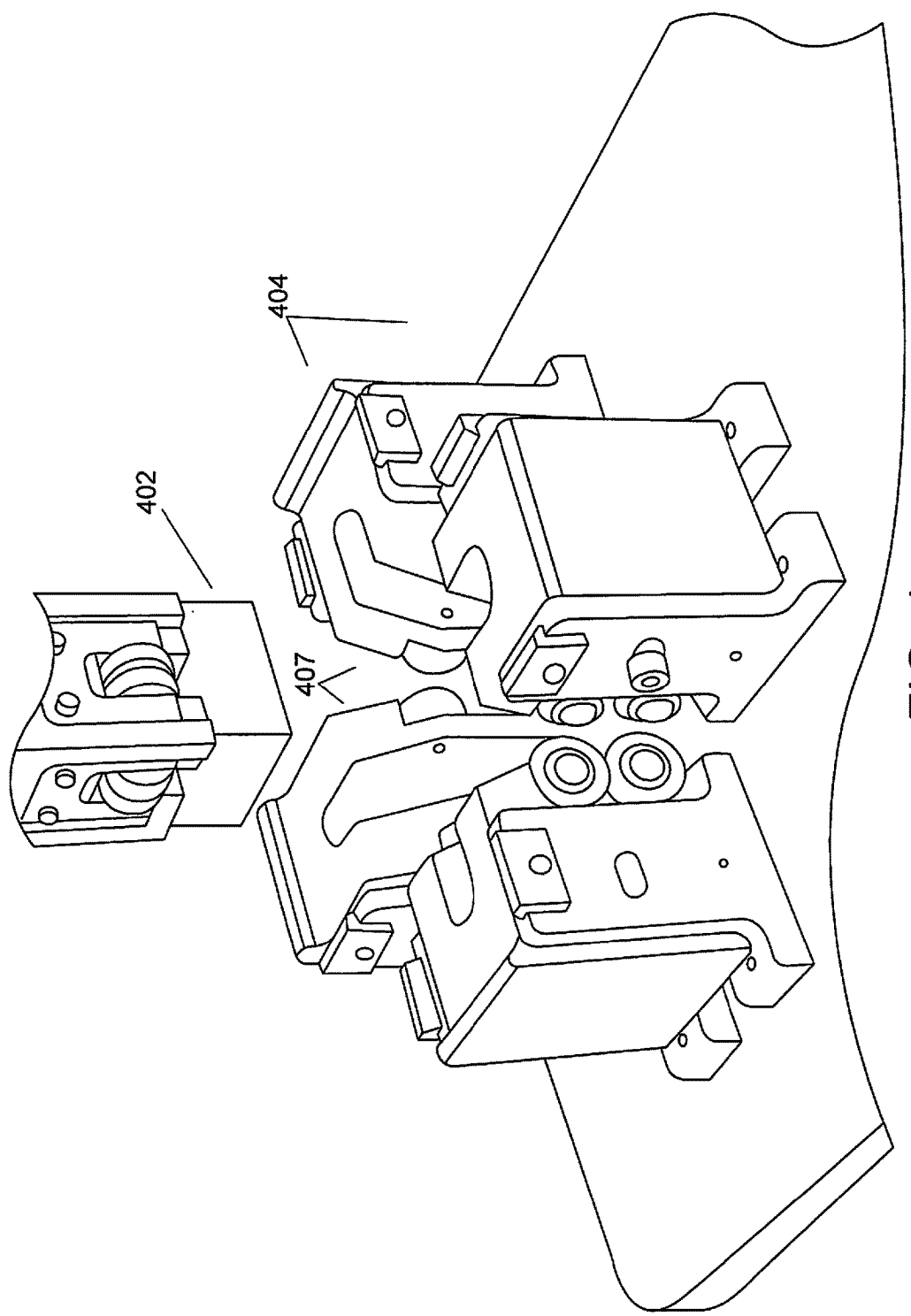
FIG. 4 shows a close-up view of the cube-shaped forming end of the mandrill in position over the cavity of a jig in alignment beneath the forming unit, according to one embodiment of the present invention.

FIG. 3 shows an expanded view of an assembly workstation comprising a mandrill 300 with a mandrill arm 301 and a cube-shaped forming end 302, a motorized unit 306 and track 308 configured for up and down movement of the mandrill arm 301. The mandrill arm 301 acts as a compression member and moves downward into the cavity of a jig 304 aligned beneath mandrill 300. FIG. 4 shows the mandrill 402 being inserted into the jig 404, the jig 404 adjusts on all sides 407 via spring loaded action, and when the mandrill releases from the jig 404, the jig 404 realigns into its resting position.

Figure 5:
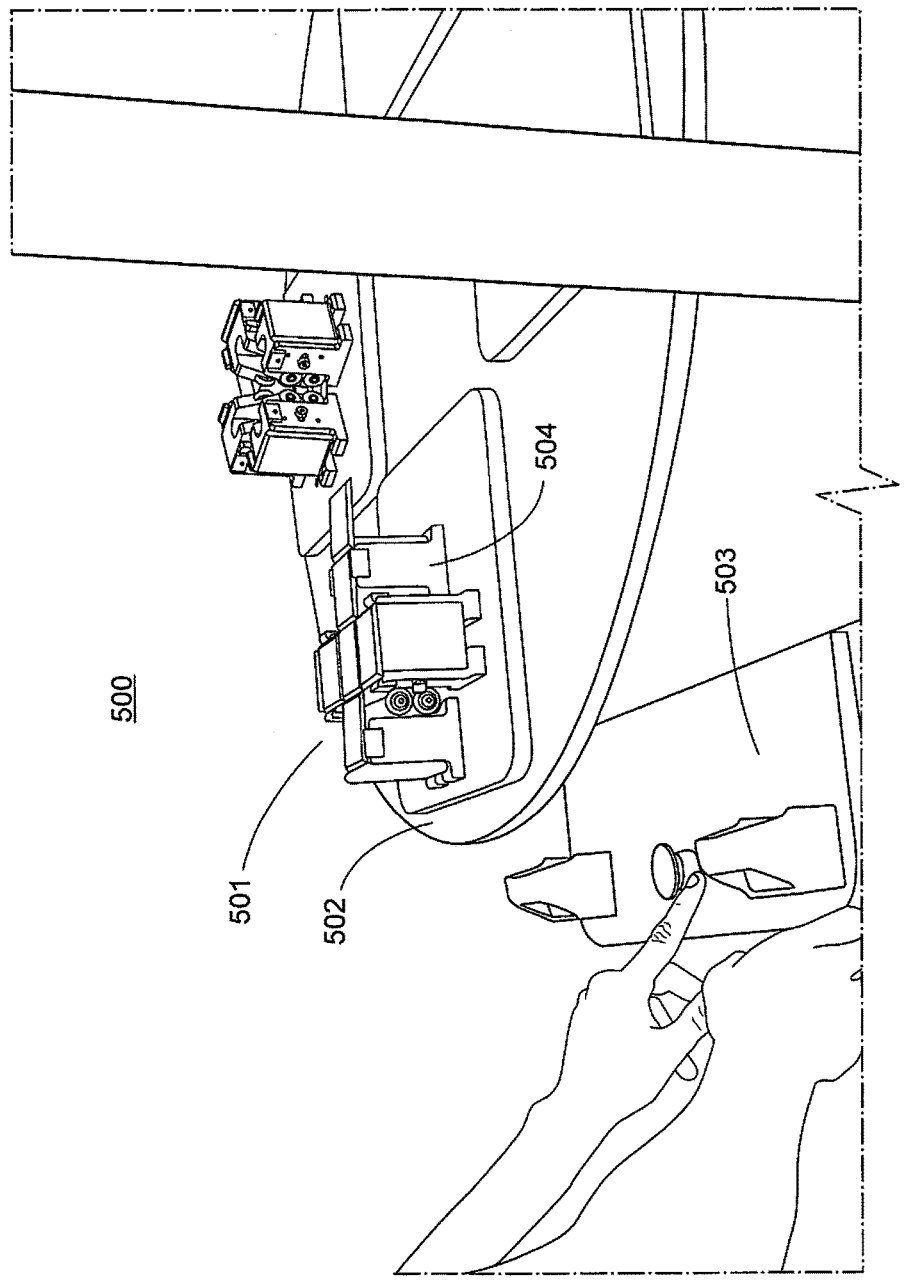
FIG. 5 shows a first work position with an unassembled image display resting along the upper portion of a jig, and an operator controlling the system via a control panel with a stop and start button, according to one embodiment of the present invention.

FIG. 5 shows a close up view of a (partial) workstation, the workstation aligned in a first work position 500. Turntable 502 is shown with an unassembled image display blank 501 resting along the upper portion of a jig 504, and an operator controlling the system via a control panel 503.

Figure 6:
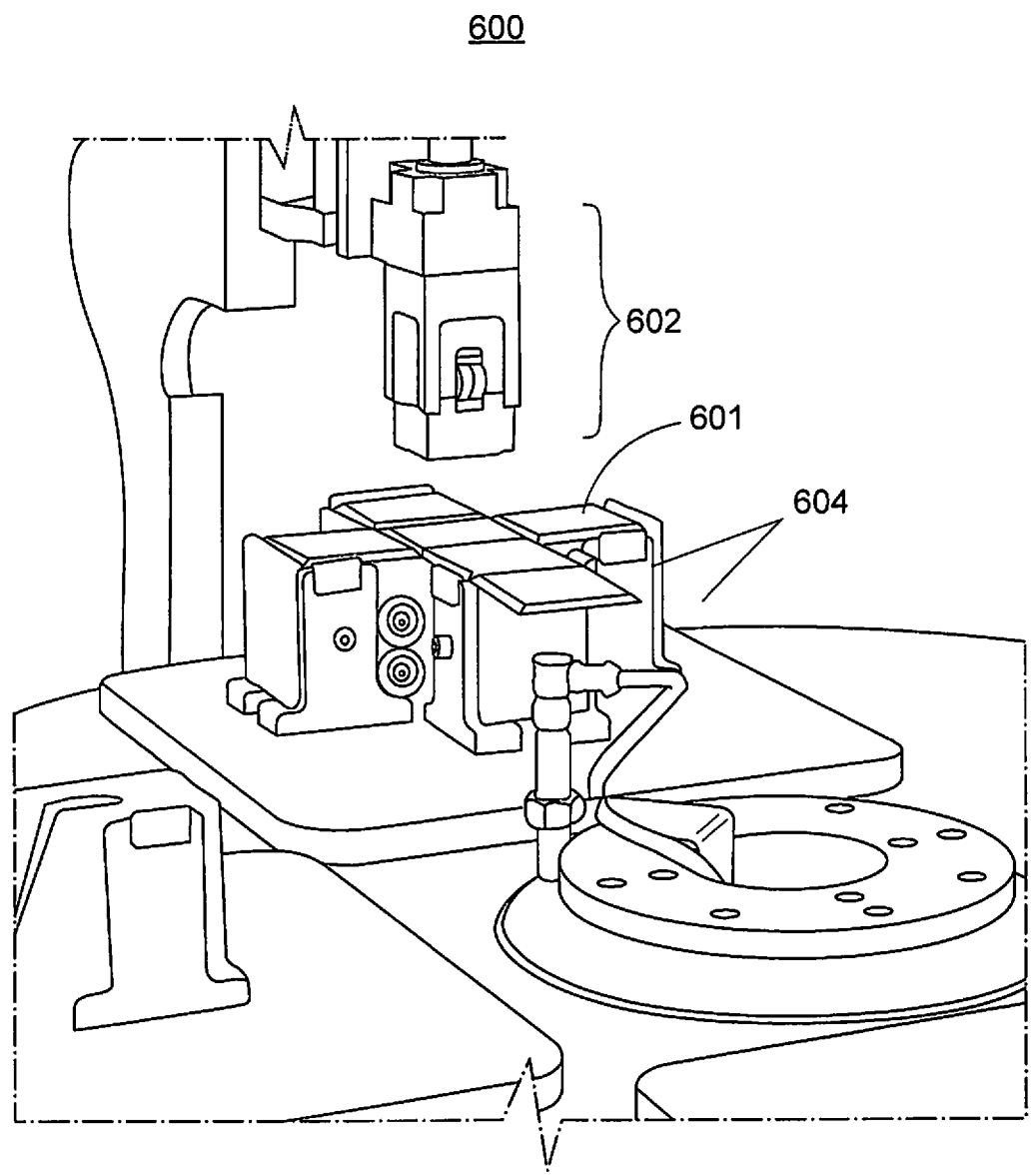
FIG. 6 shows a second work position with an unassembled image display resting along the upper portion of the jig, with an assembly unit in position over the jig, whereby the cube-shaped forming end of the compression member forces assembly of the image display by pushing the planar image display into the cavity of the jig, folding the image display along a series of v-grooves which permit folding of the sides, thereby creating a cube-shape, according to one embodiment of the present invention.
Figure 7:
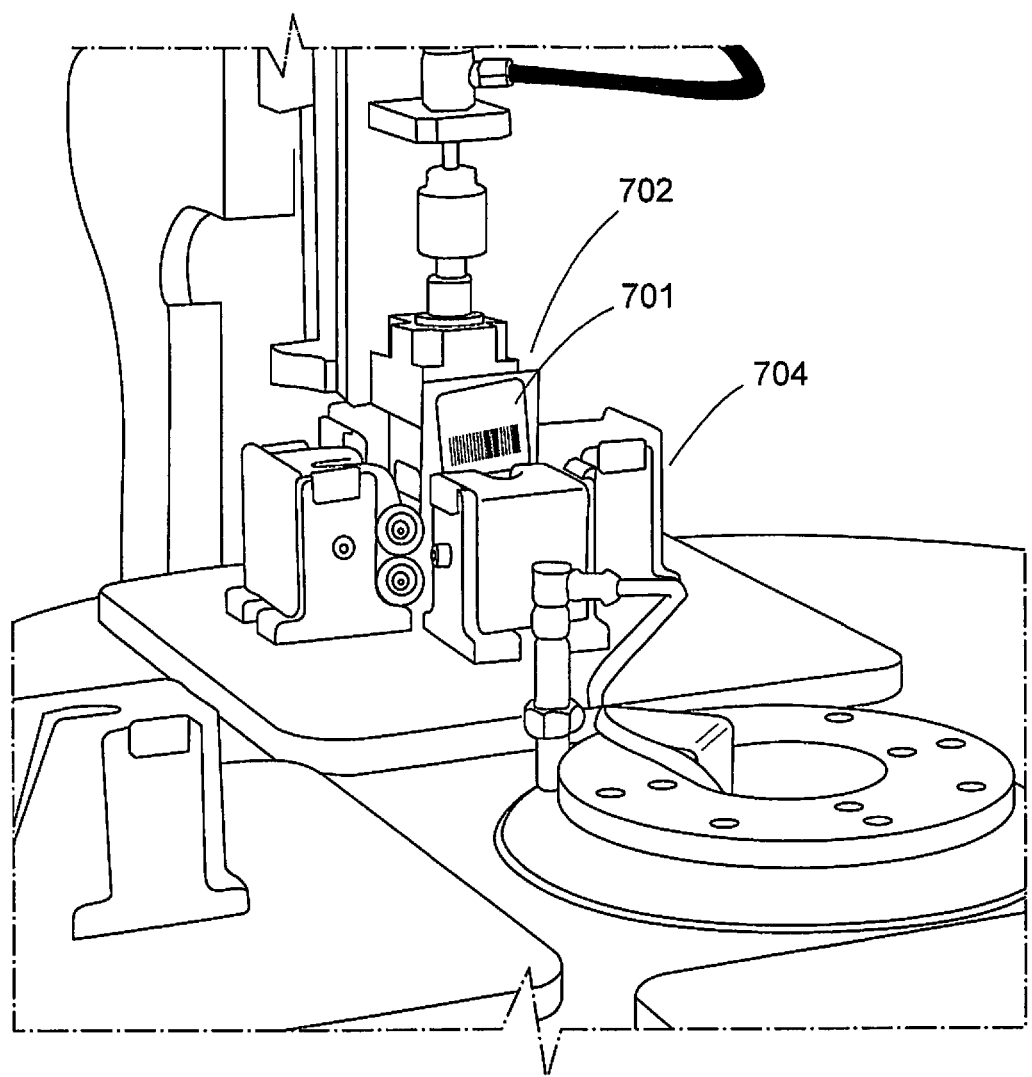
FIG. 7 shows a second work position upon folding of the image display upon insertion of the cube-shaped forming end into the cavity of the jig, according to one embodiment of the present invention.

FIGS. 6 and 7 show views of a workstation, the workstation aligned in a second work position 600. Second work position is shown with an unassembled image display blank 601 resting along the upper portion of the jig 604, with the cube shaped forming end of mandrill 602 in position over the jig 604, whereby the cube-shaped forming end of the mandrill 602 forces assembly of the image display 601 by pushing the planar image display 601 into the cavity of the jig 604. This action results, as shown in FIG. 7, in the folding of the image display 701 along a series of v-grooves into a cube shape around the forming end of mandrill 702—shown residing within jig 704. When the mandrill arm 702 is withdrawn from the jig 704, the turntable is advanced to the next (third) work position.

Figure 8:
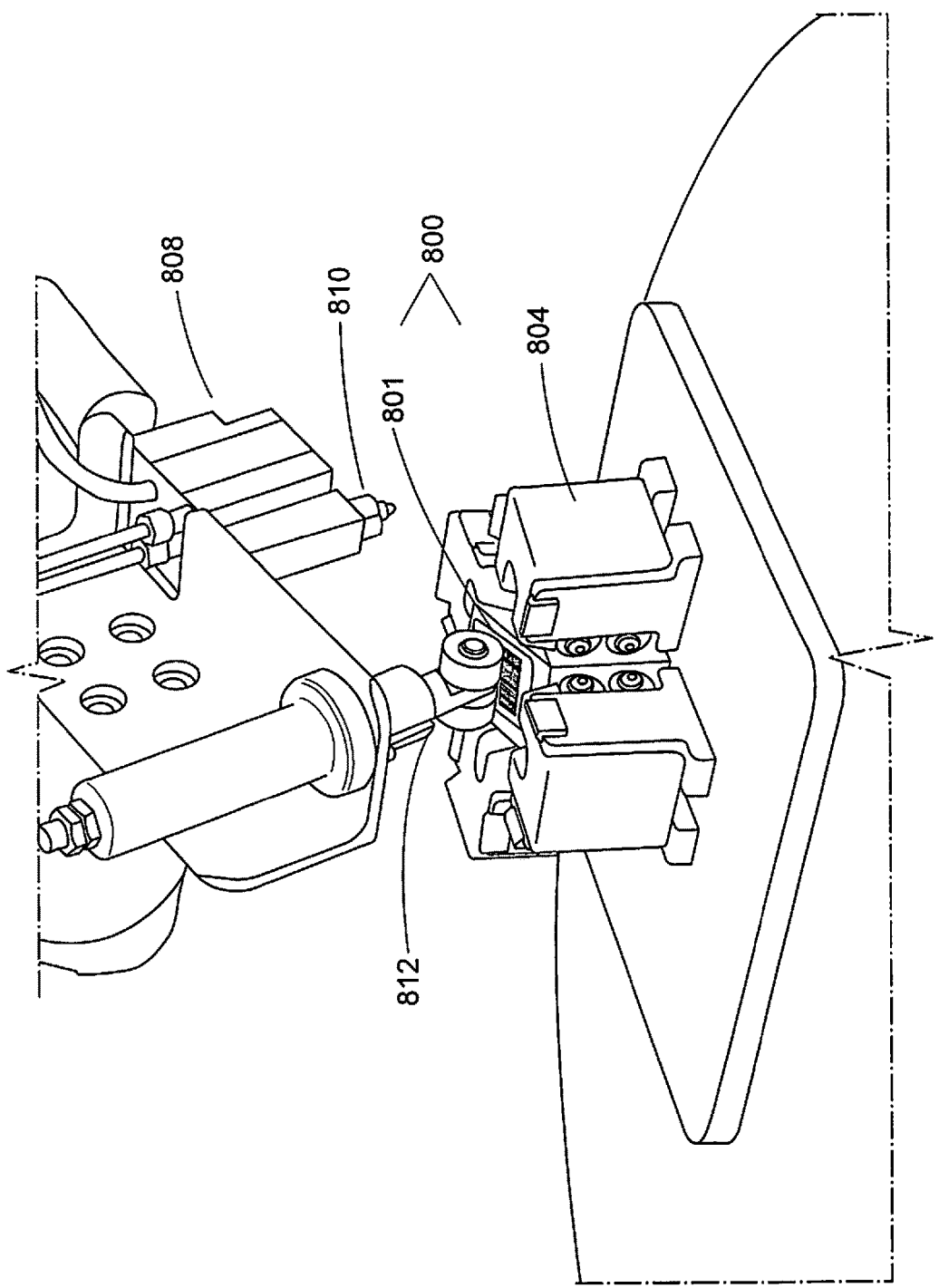
FIG. 8 shows a third work position showing application of glue/hot melt to the inner corners of the assembled image display, via the glue gun of the robotic arm, with the roller extension closing the lid of the cube by the roller, as the roller moves from one end of the jig to the other and across the top surface of the cube, thereby closing the lid of the cube, according to one embodiment of the present invention.

FIG. 8 shows a close up view of a (partial) workstation, the workstation engaged in a third work position 800 showing robotic arm 808 as it has completed an application of glue/hot melt to the inner corners of the image display 801, via the glue gun 810 of the robotic arm 808, and seals the edges of the image display 801 via the roller extension 812. A partially assembled image display 801 is fully assembled within the jig 804 by action of the robotic arm 808. Adhesive is applied to at least a portion of a blank edge or corner by adhesive member (glue gun) 810, which may be programmed for a particular dosage of adhesive and targeted to a specific area of the image display. Roller member 812 then secures the assembly as the roller moves from across the top surface of the jig from one end of the jig to the other, and across the top surface of the cube, thereby closing the lid of the cube. Robotic arm is a robotic device made up of one or more segments, and controlled by a microprocessor that control individual movements of the robotic device, including the roller member and the adhesive application member. In one embodiment, workstation robotic arm comprises one or more actuators, controllers, end effectors, and sensors—as would be known by one skilled in the art of industrial robotic design.

FIG. 9 shows a close up view of a (partial) workstation, the workstation engaged in a fourth work position 900, showing a fully-assembled and securely sealed image display cube 901, as it is pushed out of the jig 904 via action of the pneumatic member beneath the turntable 902, as the pneumatic member moves upward from beneath the turntable and traverses the worktable through an opening at the center of the jig in the worktable, which permits contact between the pneumatic member and the bottom area of the jib, forcing the assembled image display out of the inner cavity of the jib. This releases the fully assembled image display, which in turn can then be removed from the workstation.

It will be clear to a person skilled in the art that features described in relation to any of the embodiments described above can be applicable interchangeably between the different embodiments. The embodiments described above are examples to illustrate various features of the invention, and they are not exhaustive or exclusive.

Throughout the description and claims of this specification, the words "comprise" and "contain" and variations of them mean "including but not limited to", and they are not intended to (and do not) exclude other additives, components, materials or steps. Throughout, the singular encompasses the plural unless the context otherwise requires. In particular, where the indefinite article is used, the specification is to be understood as contemplating plurality as well as singularity, unless the context requires otherwise.

Features, materials, characteristics, described in conjunction with a particular aspect, embodiment or example of the invention are to be understood to be applicable to any other aspect, embodiment or example described herein unless incompatible therewith. The invention is not restricted to the details of any foregoing embodiments. The invention extends to any novel one, or any novel combination, of the features disclosed in this specification (including any accompanying claims, abstract and drawings), or to any novel one, or any novel combination, of the elements so disclosed.

What is claimed is:

1. A method of manufacturing an image display having multiple image display sides, the method comprising:

provM a substantially planar blank corresponding to an unassembled form of the image display, the blank terminating in perimeter edges, the blank having an image face and a non-image face opposite the image face, the faces extending between the perimeter edges, and a plurality of v-grooves extending in planar directions along the non-image face and inwardly from the non- image face without traversing the image face to create corresponding fold lines in the blank, the v-grooves spaced from each other to define portions of the blank, the portions corresponding to the image display sides of the image display when assembled, the v-grooves comprising channels having opposing walls;

positioning a first portion of the blank in alignment with an aperture sized to receive the first portion therein, the aperture having sidewalls extending by a predetermined depth to terminate in a bottom area, the bottom area and the first portion spaced from each other by a predetermined distance;

moving the first portion of the blank and the aperture relative to each other to reduce the distance between the first portion and the bottom area;

providing additional portions of the blank secured adjacent to the first portion and having corresponding v-grooves between the first portion and the additional portions;

guiding the additional portions along the sides of the aperture, wherein the first portion is urged a sufficient distance to bring the opposing walls of the corresponding v-grooves between the first portion and the additional portions into opposing relationships corresponding to the positions of the image display sides of the image display when assembled;

folding at least one of the portions of the blank so that at least one of the perimeter edges is in opposing contact with at least one other perimeter edge;

moving the first portion and the bottom area of the aperture relatively away from each other by an amount sufficient to access the image display sides.

2. The method of claim 1, wherein the step of providing the blank comprises defining the first portion of the blank and the additional portions adjacent to the first portion as square portions, the first portion having four v-grooves defining four corresponding right angles and defining the first portion as a first square portion; and wherein the step of moving the first portion and the aperture relative to each other comprises moving the first square portion relative to the aperture by an amount sufficient to bring opposing walls of the four v-grooves into opposing contact to define a base and four sides having upper edges, the four sides extending orthogonally from the base;

wherein the folding step comprises moving a sixth square portion of the blank having edges defining a sixth square perimeter to have the edges of the sixth square perimeter oppose the upper edges of the four sides to form a cube.

3. The method of claim 1, further comprising the step of generating a positive signal when the first portion is positioned in alignment with the aperture.

4. The method of claim 1, wherein the steps of moving the first portion and the aperture relative to each other, guiding the adjacent portions, applying adhesive, and folding the at least one portion are performed without manual intervention.

5. The method of claim 1, wherein the step of positioning the first portion of the blank in alignment with the aperture comprises supporting the blank at locations along the perimeter edges of the blank.

6. The method of claim 1, wherein the step of moving the first portion and the aperture to reduce the distance includes applying force to the non-image surface to urge the first portion toward the bottom area of the aperture.

7. The method of claim 1, further comprising the steps of maintaining the first portion received in the aperture while performing the steps of guiding the additional portions along the sidewalls of the aperture, applying the adhesive, and folding.

8. The method of claim 1, further comprising the step of fully assembling the image display in four stages.

9. The method of claim 1, further comprising cycling the blank through four stations to form the image display, the first station performing the step of aligning the blank with the aperture by receiving the blank and engaging the perimeter edges to align the first portion of the blank with the aperture and to maintain the first portion a predetermined distance from the bottom area of the aperture, the second station performing the step of moving the first portion and bottom area relative to each other by urging the first portion toward the bottom area while guiding the additional, adjacent portions along the sidewalls of the aperture to form the image display sides, the third station performing the steps of applying adhesive at least to the perimeter edges corresponding to upper side edges of the additional portions and thereafter folding at least one portion to contact the adhesive disposed on upper side edges, and the fourth station performing the step of moving the first portion and the bottom area relative to each other by an amount sufficient to access the display sides by moving the folded blank away from the bottom area.

* * * * *